United States Patent
Lebouitz et al.

(10) Patent No.: US 8,257,602 B2
(45) Date of Patent: Sep. 4, 2012

(54) PULSED-CONTINUOUS ETCHING

(75) Inventors: Kyle S. Lebouitz, Pittsburgh, PA (US); David L. Springer, Pittsburgh, PA (US)

(73) Assignee: Xactix, Inc., Pittsburgh, PA (US)

( * ) Notice: Subject to any disclaimer, the term of this patent is extended or adjusted under 35 U.S.C. 154(b) by 1064 days.

(21) Appl. No.: 12/095,626

(22) PCT Filed: Nov. 30, 2006

(86) PCT No.: PCT/US2006/045879
§ 371 (c)(1),
(2), (4) Date: Aug. 6, 2008

(87) PCT Pub. No.: WO2007/064812
PCT Pub. Date: Jun. 7, 2007

(65) Prior Publication Data
US 2010/0126963 A9    May 27, 2010

Related U.S. Application Data

(60) Provisional application No. 60/741,517, filed on Dec. 1, 2005.

(51) Int. Cl.
*B44C 1/22* (2006.01)
*C23F 1/08* (2006.01)

(52) U.S. Cl. .......................................... 216/59; 216/73

(58) Field of Classification Search .................. None
See application file for complete search history.

(56) References Cited

U.S. PATENT DOCUMENTS

| | | | |
|---|---|---|---|
| 6,290,864 B1 | 9/2001 | Patel et al. | |
| 6,409,876 B1 | 6/2002 | McQuarrie et al. | |
| 6,887,337 B2 | 5/2005 | Lebouitz et al. | |
| 8,003,934 B2 * | 8/2011 | Hieke | 250/288 |
| 2002/0033229 A1 * | 3/2002 | Lebouitz et al. | 156/345 |
| 2005/0230046 A1 | 10/2005 | Lebouitz et al. | |
| 2006/0248934 A9 * | 11/2006 | Mizohata | 72/200 |

FOREIGN PATENT DOCUMENTS

JP    3211281 A    9/1991

OTHER PUBLICATIONS

Williams, Kirt Reed, "Micromachined Hot-Filament Vacuum Devices", PhD Dissertation, U.C. Berkeley, May 1997, pp. 342-416.
Chu et al., "Controlled Pulse-Etching with Xenon Difluoride", 1997 International Conference on Solid State Sensors and Actuators-Transducers, Jun. 16-19, 1997, 4 pages, Chicago, USA.

* cited by examiner

*Primary Examiner* — Allan Olsen
(74) *Attorney, Agent, or Firm* — The Webb Law Firm

(57) ABSTRACT

In a system and method of etching a sample disposed in an etching chamber, a plurality of separately stored charges of an etching gas is discharged, one at a time, into a sample etching chamber. The discharge of each charge of etching gas occurs such that a momentary overlap exists in the end discharge of one charge of etching gas with the beginning discharge of another charge of etching gas, whereupon the desired flow of etching gas into the etching chamber is maintained. During discharge of one charge of etching gas, a previously discharged charge of etching gas is recharged. The process of discharging a plurality of separately stored charges of an etching gas, one at a time, and recharging at least one previously discharged charges of etching gas during the discharge of at least one charge of etching gas continues until the sample is etched to a desired extent.

7 Claims, 2 Drawing Sheets

PULSED-CONTINUOUS ETCHING

BACKGROUND OF THE INVENTION

1. Field of the Invention

The present invention relates to vapor etching of samples, such as semiconductor materials and/or substrates, and, more particularly, to a system and method of vapor etching a sample.

2. Description of Related Art

Vapor etching of semiconductor materials and/or substrates is accomplished using gases, such as xenon difluoride. Specifically, in xenon difluoride etching, the xenon difluoride gas reacts with solid materials, such as silicon and molybdenum, such that the materials are converted to a gas phase and removed. This removal of these materials is known as etching.

Adding non-etching gases to the xenon difluoride can offer improvements to the etch process as described by Kirt Reed Williams,"Micromachined Hot-Filament Vacuum Devices," Ph.D. Dissertation, UC Berkeley, May 1997, p. 396, U.S. Pat. Nos. 6,409,876, and 6,290,864. The advantages of adding non-etchant gases to xenon difluoride etching gas are noted in U.S. Pat. No. 6,290,864 and include improved selectivity, which is the ratio of etching of the material to be etched versus those materials that are intended to remain, and uniformity. Increases in both of these parameters ultimately lead to improved yield.

A common approach to xenon difluoride etching is through the pulsed method of etching. Information regarding pulsed mode etching can be found in Chu, P. B.; J. T. Chen; R. Yeh; G. Lin; J. C. P. Huang; B. A. Warneke; K. S. J. Pister *"Controlled PulseEtching with Xenon Difluoride"*; 1997 International Conference on Solid State Sensors and Actuators—TRANSDUCERS '97, Chicago, USA, June 16-19, pp. 665-668. In the pulsed mode of etching, xenon difluoride is sublimated from a solid to a gas in an intermediate chamber, referred to as an expansion chamber, which can then be mixed with one or more other gases. The gas(es) in the expansion chamber can then flow into an etching chamber to etch the sample, referred to as the etching step. The main chamber is then emptied through a vacuum pump and this cycle, including the etching step, is referred to as an etching cycle. These cycles are repeated as necessary to achieve the desired amount of etching.

Alternatively, xenon difluoride etching can be accomplished using a continuous method, such as that described in U.S. Pat. No. 6,409,876, where a single reservoir is connected to a flow controller to provide a constant flow of xenon difluoride gas to the sample to be etched. In addition, a means of mixing an additional, inert, gas to the etch gas between the outlet side of the flow controller and the inlet of the chamber is described.

Adding an additional gas, typically an inert or minimally reacting gas, such as nitrogen, to the etching process must be accomplished keeping in mind the sublimation pressure of xenon difluoride. Often, the partial pressure of the additional, non-etching gas is higher than the sublimation pressure, which is the pressure below which xenon difluoride is a gas and above which it is a solid. At 25° C., the sublimation pressure of xenon difluoride is approximately 4 torr. It is not uncommon during pulsed etching to mix in high pressures of other gases, such as nitrogen, into the expansion chamber after the expansion chamber has been filled with a few torr of xenon difluoride, to high pressures such as 30 torr, However, in a continuous process, such as that described in U.S. Pat. No. 6,409,876, the pressure of the additional gas mixed into the xenon difluoride would have to be less than the pressure of the supplied xenon difluoride gas. The reason for this limitation is that additional gas pressures higher than the xenon difluoride pressure between the outlet of the flow controller and the inlet to the etching chamber would cause the xenon difluoride to stop flowing through the controller.

It would, therefore, be desirable to provide a system and method of allowing the substantially continuous flowing of xenon difluoride gas with mixture of high pressures of additional gases.

SUMMARY OF THE INVENTION

To maintain long duration, continuous etches, the present invention utilizes multiple expansion chambers, which allows one expansion chamber to be used for etching while the other is being prepared.

The gases can be any inert gas, such as helium, nitrogen, or argon. Mixtures of inert gases are also possible. Note that the term "inert" is used to refer to any gas that minimally reacts with the etching chemistry and is also referred to as a non-etching gas.

In addition, other vapor-phased etching gases, such as bromine trifluoride, could be used in addition to or in place of xenon difluoride.

More specifically, the invention is a method of etching a sample via an etching system having an etching gas source, a main chamber where etching of a sample occurs, a first expansion chamber, a second expansion chamber and means for selectively connecting each expansion chamber to the main chamber and the source of etching gas. The method includes (a) controlling the means for selectively connecting whereupon the first expansion chamber is charged with a desired amount of etching gas from the etching gas source and once charged is isolated therefrom; (b) controlling the means for selectively connecting to connect the charged first expansion chamber to the main chamber whereupon the charge of etching gas in the first expansion chamber flows to the main chamber; (c) while etching gas in the first expansion chamber is flowing to the main chamber, controlling the means for selectively connecting whereupon the second expansion chamber is charged with a desired amount of etching gas from the etching gas source, and once charged is isolated therefrom; (d) following step (c) and while etching gas is flowing from the first expansion chamber to the main chamber, controlling the means for selectively connecting to isolate the first expansion chamber from the main chamber; (e) following step (d), controlling the means for selectively connecting to connect the charged second expansion chamber to the main chamber, whereupon the charge of etching gas in the second expansion chamber flows to the main chamber; (f) while etching gas in the second expansion chamber is flowing to the main chamber, controlling the means for selectively connecting whereupon the first expansion chamber is charged with a desired amount of etching gas from the etching gas source, and once charged is isolated therefrom; (g) following step (f) and while etching gas is flowing from the second expansion chamber to the main chamber, controlling the means for selectively connecting to isolate the second expansion chamber from the main chamber; and (h) following step (g), controlling the means for selectively connecting to connect the charged first expansion chamber to the main chamber, whereupon the charge of etching gas in the first expansion chamber flows to the main chamber, wherein the isolation of the first expansion chamber and the connection of the second expansion chamber, and vice versa, to the main chamber occurs in a manner that maintains a substantially continuous flow of etching gas to the main chamber.

The method can further include repeating steps (c)-(h).

The isolation of the corresponding expansion chamber in at least one of step (d) and step (g) can occur as a function of at least one of a pressure of the etching gas in the expansion chamber or a position of a flow control valve in-line with the flow of etching gas into the main chamber.

Each of step (a), (c) and (f) can include controlling the means for selectively connecting whereupon the expansion chamber is also charged with an inert gas from the inert gas source coupled to the means for selectively connecting.

The inert gas can be nitrogen, helium, argon, xenon or some combination thereof.

Each charge of inert gas can be introduced into the corresponding expansion chamber before or after the introduction of the charge of etching gas into the expansion chamber, desirably after.

The method can further include controlling a rate of flow of the etching gas to the main chamber and/or controlling a pressure of the etching gas in the main chamber.

The invention is also a vapor etching system that includes a source of etching gas; a main chamber where etching of a sample occurs; first and second expansion chambers; means for selectively connecting each expansion chamber to the main chamber and the source of etching gas; and a controller operative for: controlling the means for sequentially selectively connecting to charge the second expansion chamber with etching gas from the source of etching gas while the first expansion chamber is introducing a charge of etching gas previously introduced thereinto from the source of etching gas into the main chamber, and vice versa; and controlling the means for sequentially selectively connecting to alternately connect each expansion chamber to the main chamber in a manner that maintains a substantially constant flow of etching gas into the main chamber.

The vapor etching system can further include at least one of (1) means for controlling a rate of flow of gas into the main chamber; and (2) means for controlling a pressure of gas in the main chamber.

The vapor etching system can further include a source of mixing gas(es), wherein the means for selectively connecting also selectively connects each expansion chamber to the source of mixing gas(es).

The source of etching gas can include first and second sources of etching gas, wherein the means for selectively connecting is operative for selectively connecting the first and second sources of etching gas to the first and second expansion chambers, respectively. The source of mixing gas(es) includes first and second source of mixing gas(es), wherein the means for selectively connecting is operative for selectively connecting the first and second source of mixing gas (es) to the first and second expansion chambers, respectively.

The vapor etching can further include a source of vacuum, wherein the means for selectively connecting is operative for selectively connecting the source of vacuum to the main chamber.

The vapor etching system can further include at least one of the following: a first pressure sensor operative for outputting to the controller a signal corresponding to a pressure in the first expansion chamber; a second pressure sensor operative for outputting to the controller a signal corresponding to a pressure in the second expansion chamber; and a third pressure sensor operative for outputting to the controller a signal corresponding to a pressure in the main chamber.

The vapor etching system can further include a source of venting gas, wherein the means for selectively connecting is operative for selectively connecting the source of venting gas to the main chamber.

The means for selectively connecting can include a plurality of valves operating under the control of the controller.

Lastly, the invention is a method of etching a sample disposed in an etching chamber. The method comprises (a) discharging a plurality of separately stored charges of an etching gas, one at a time, into an etching chamber in which a sample to be etched is disposed, whereupon a substantially constant flow of etching gas into the etching chamber is maintained and the discharge of each charge of etching gas is terminated while there is a sufficient amount of etching gas remaining to support a desired flow of etching gas into the etching chamber; (b) during discharge of at least one charge of etching gas, recharging at least one previously discharged charges of etching gas; and (c) repeating steps (a) and (b) until the sample is etched to a desired extent.

Each discharge can be terminated as a function of at least one of: a pressure of the corresponding charge of etching gas; or a position of a valve in-line with the discharge of etching gas into the etching chamber.

Each charge of etching gas can include an inert gas, such as nitrogen, helium, argon, xenon or some combination thereof.

DETAILED DESCRIPTION OF THE INVENTION

Figure 1:
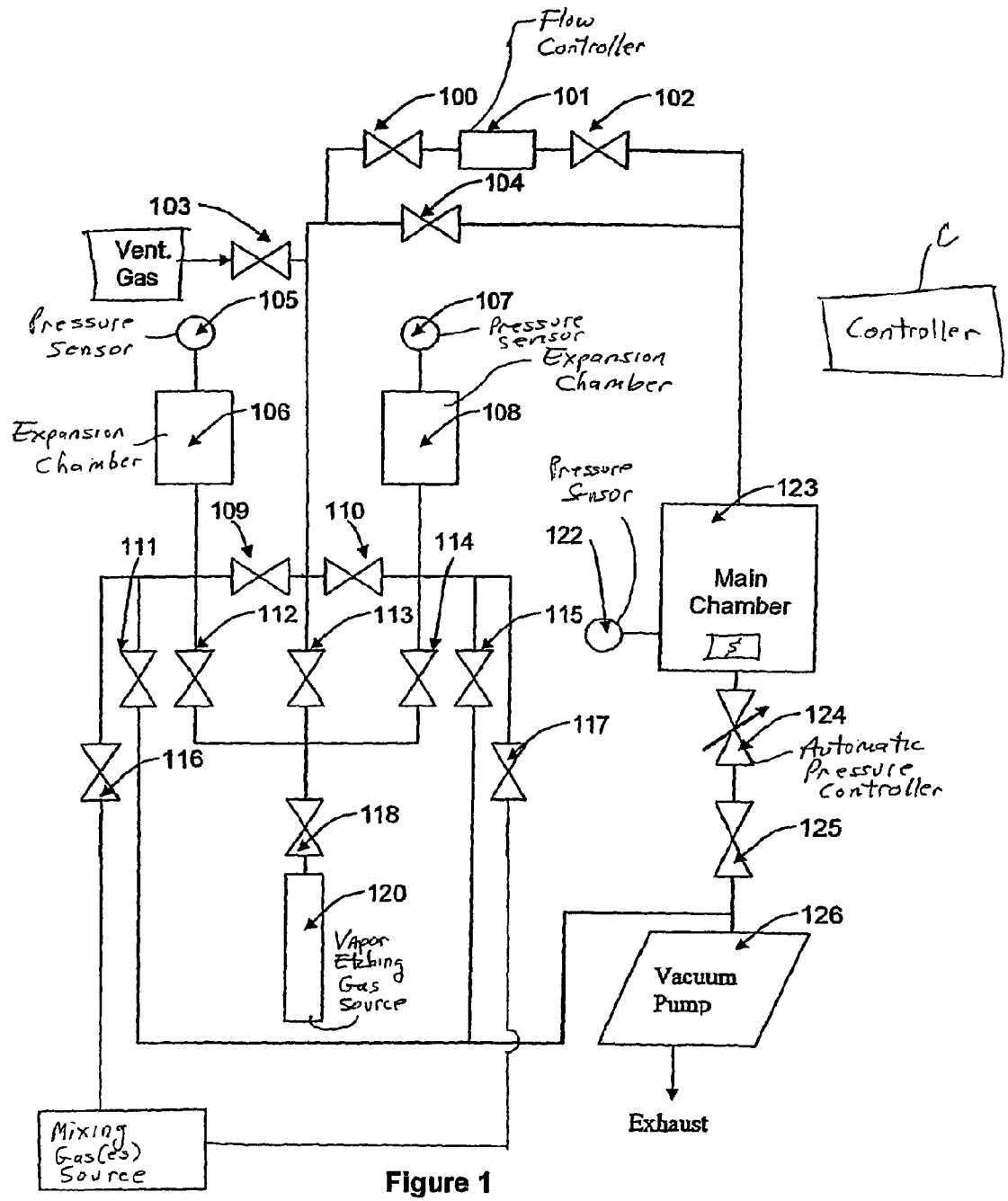
FIG. 1 is a diagrammatic view of an etching system in accordance with the present invention.
Figure 2:
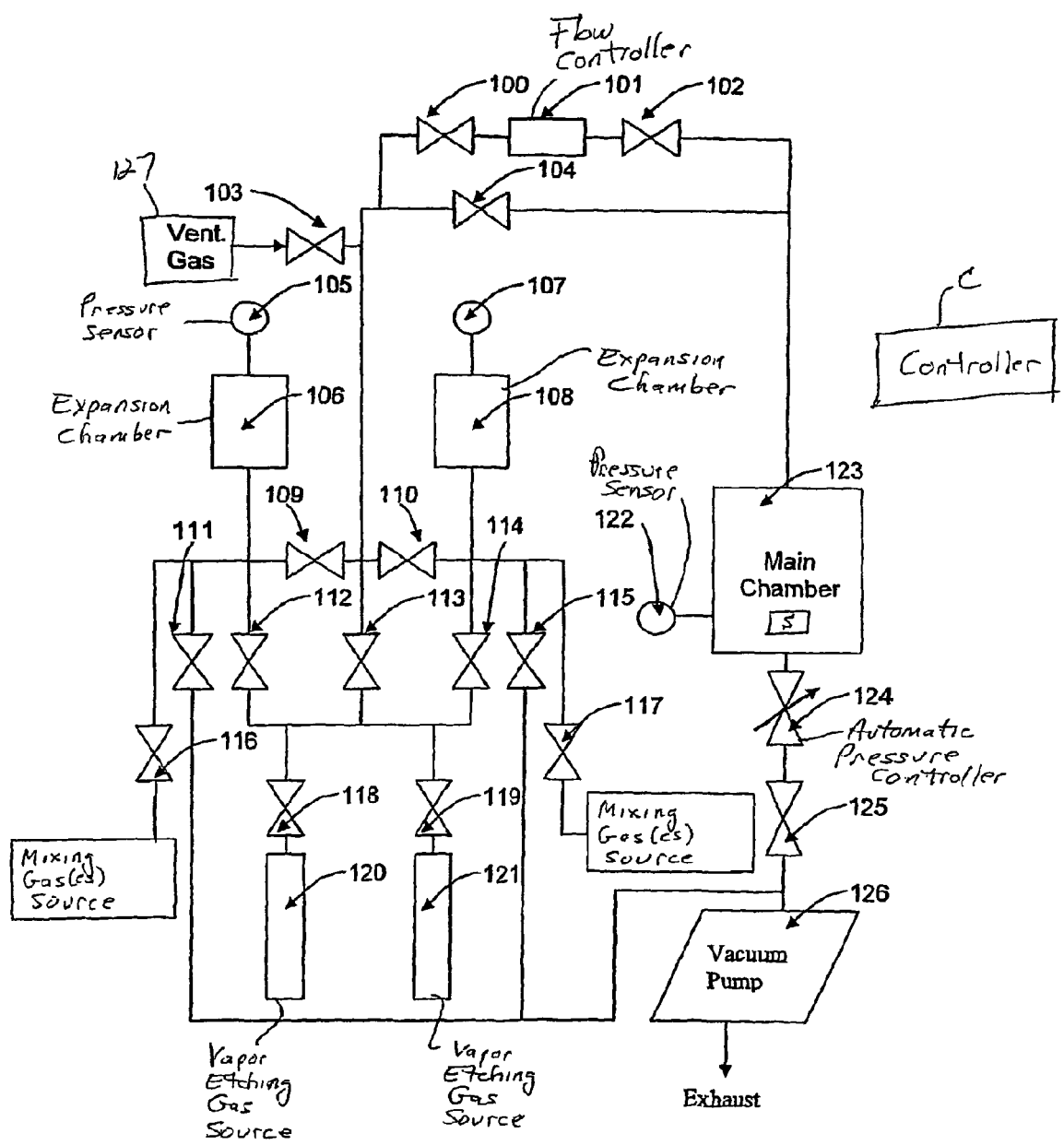
FIG. 2 is a diagrammatic view of another etching system in accordance with the present invention.

With reference to FIG. 1, a vapor etching gas source 120, which is usually a cylinder of etching gas, such as xenon difluoride, is connected to a shutoff valve 118. Shutoff valves 112 and 114 are connected to expansion chambers 106 and 108, which are used as intermediate chambers to regulate the quantity of etching gas in each cycle. Expansion chambers 106 and 108 can be optionally independently evacuated through shutoff valves 111 and 115. Expansion chambers 106 and 108 can also have coupled thereto pressure sensors 105 and 107, which are typically capacitance diaphragm gauges. In addition, expansion chambers 106 and 108 have additional connections to shutoff valves 116 and 117 to allow mixing gas(es), such as nitrogen, to be mixed with the xenon difluoride in expansion chambers 106 and 108. In series with shutoff valves 116 and 117 can also be needle valves or other flow restrictions (not shown) and additional shutoff valves (not shown) to provide additional control of the flow of the incoming mixing gas(es). Mixing gas(es) can be provided to shutoff valves 116 and 117 from a single mixing gas source, as shown in FIG. 1, or from separate mixing gas sources, as shown in FIG. 2. Similarly, vapor etching gas can be provided to shutoff valves 112 and 114 from a single vapor etching gas source 120, as shown in FIG. 1, or from separate vapor etching gas sources 120 and 121, as shown in FIG. 2.

Expansion chambers 106 and 108 are connected to a main chamber 123 via a flow path that includes shutoff valves 109 and 110, which then split into two paths, one through a flow controller 101 with additional shutoff valves 100 and 102, or another which bypasses the flow controller 101 via a shutoff valve 104. Flow controller 101 is one that is designed for controlling flow with low pressure drops, such as those designed for SDS, or Safe Delivery Systems, like those provided by Celerity, Inc. of Milpitas, Calif., USA.

Xenon difluoride gas can also be introduced into main chamber 123 without flowing through the expansion chambers 106 or 108 by flowing directly through a shutoff valve 113.

Main chamber 123 can be vented, or filled with an inert gas to raise the pressure to atmosphere for opening, via a shutoff valve 103. Shutoff valve 103 could alternatively be located in the flow path to main chamber 123 on the other side of shutoff valve 104.

Pressure in main chamber 123 is monitored via a pressure sensor 122 coupled to main chamber 123 and which is preferably a capacitance diaphragm gauge. The pressure in main chamber 123 is controlled using an automatic pressure controller 124, which adjusts the conductance between main chamber 123 and vacuum pump 126. Such pressure controllers are available from MKS Instruments of Wilmington, Mass., USA. Vacuum pump 126 is desirably a dry vacuum pump. In addition, the connection between main chamber 123 and vacuum pump 126 can be fully isolated via a vacuum valve 125.

Desirably, a controller C is operative for controlling the operation of all or some of the valves, flow controller 101 and/or automatic pressure controller 124 in accordance with the present invention. However, this is not to be construed as limiting the invention since it is envisioned that one or more of the shutoff valves, flow controller 101 and/or automatic pressure controller 124 can be controlled manually. In addition, one or more of pressure sensors 105, 107 and 122 can have an output coupled to controller C which can be utilized by controller C, along with flow controller 101 and/or automatic pressure controller 124, for controlling the flow of gas through main chamber 123.

Other modifications to the aforementioned system are envisioned such as those described in U.S. Pat. No. 6,887,337, which is incorporated herein by reference, including, but not limited to, variable volume expansion chambers, more than two expansion chambers, and multiple gas sources. The addition of multiple gas sources is shown in FIG. 2 where additional gas source 121 and an additional valve 119 are shown. Additional gas sources could be added in a similar fashion.

In addition, the use of other noble gas fluorides, such as krypton difluoride, halogen fluorides, or bromine trifluoride, are also considered for etching. In addition, combinations of these gases are also considered.

A typical etching sequence is to load a sample S into main chamber 123. Main chamber 123 is then evacuated through opening vacuum valve 125 and automatic pressure controller 124 which connect vacuum pump 126 to main chamber 123. Typically, main chamber 123 is pumped down to 0.3 torr. Main chamber 123 may be further purged of atmosphere by first closing vacuum valve 125, opening shutoff valves 103 and 104, and flowing venting gas, such as, without limitation, nitrogen, into main chamber 123 from a venting gas source 127 to approximately 400 torr (anywhere from 1 torr to 600 torr would be useful, though). The sequence of pumps and purges can be repeated typically three or more times to minimize moisture and undesired atmospheric gases in main chamber 123. Most critically, moisture can react with xenon difluoride and other etching gases to form hydrofluoric acid which will attack many non-silicon materials.

The etching sequence can then proceed as follows. Expansion chamber 106 is evacuated through shutoff valve 111, typically to around 0.3 torr as monitored by pressure sensor 105, and is then filled (charged) to the, desired pressure (or amount) of vapor etching gas, as monitored by pressure sensor 105, by opening and then closing shutoff valves 118 and 112. Expansion chamber 106 can then be further filled (charged) with the additional mixing gases to a specific pressure (or amount) as monitored by pressure sensor 105 by opening and then closing shutoff valve 116. Expansion chamber 108 can then be similarly charged with vapor etching gas and mixing gas(es) for use through the controlled opening and closing of shutoff valves 115 (vacuum), 118 and 114 (vapor etching gas), and 117 (mixing gas) using pressure sensor 107 to monitor the pressure in expansion chamber 106.

Expansion chamber 108 can be charged as described above while expansion chamber 106 is being used for etching. To use expansion chamber 106 for etching after it has been charged as described above, flow controller 101 is set, either manually or via controller C, to a setpoint flow rate, typically in the range of a few standard cubic centimeters (sccm) of flow. Automatic pressure controller 124 is also set, either manually or via controller C, to a setpoint pressure, typically around one torr. Etching commences by opening shutoff valves 109, 100 and 102, and vacuum valve 125. During the time these shutoff valves are open, the flow of the gas mixture from expansion chamber 106 will be controlled to the setpoint flow rate and the pressure in main chamber 123 will also rise to the setpoint pressure.

As the etch progresses, the pressure in expansion chamber 106 will fall and flow controller 101 will need to continue to open its internal control valve (not shown) to maintain the setpoint flow rate of the etching gas mixture to main chamber 123. As the control valve of flow controller 101 nears, for example, approximately 90% of fully open, there is sufficient likelihood that the flow rate through the flow controller 101 will begin to drop below the setpoint flow rate.

Accordingly, at this juncture, shutoff valve 109 is closed and shutoff valve 110 is opened so that the etching gas mixture to main chamber 123 comes from expansion chamber 108. Desirably, the closing of shutoff valve 109 and the opening of shutoff valve 110 occurs in a manner to maintain a substantially continuous flow of the etching gas mixture to main chamber 123. To this end, it is envisioned that shutoff valve 110 can be opened before, after or at substantially the same time that shutoff valve 109 is closed. Desirably, shutoff valve 110 is opened a few moments before shutoff valve 109 is closed, whereupon expansion chambers 108 and 106 are both connected to supply etching gas mixture to main chamber 123. To avoid the flow of the etching gas mixture from the higher pressure expansion chamber 108 into the lower pressure expansion chamber 106 when shutoff valves 109 and 110 are both open, a suitable anti-back flow feature (not shown) can be incorporated in-line with the flow of the etching gas mixture through shutoff valve 109 to avoid or prevent the etching gas mixture from flowing from expansion chamber 108 to expansion chamber 106. This anti-back flow feature can include a sensor for measuring a flow direction of the etching gas mixture coupled to controller C which is responsive thereto for closing shutoff valve 109 upon detection of the flow of etching gas mixture from expansion chamber 108 to expansion chamber 106; a check valve that avoids or prevents the flow of etching gas mixture from expansion chamber 108 to expansion chamber 106, or any other suitable and/or desirable means.

During the switch of the source of the etching gas mixture from expansion chamber 106 to expansion chamber 108, the pressure to the inlet side of flow controller 101 will rapidly increase. To counteract this sudden pressure increase, it is envisioned that a preemptive adjustment (e.g., a partial closing) of the valve position in flow controller 101 will be made when switching between expansion chambers in order to maintain the flow rate of the etching gas mixture at or near the setpoint flow rate.

As the etch continues to progress, the pressure in expansion chamber 108 will fall, whereupon flow controller 101 will continue to open its control valve to maintain the setpoint flow rate of the etching gas mixture to main chamber 123. As the control valve of flow controller 101 nears, for example, approximately 90% of fully open, shutoff valve 110 is closed and shutoff valve 109 is open so that the etching gas mixture to main chamber 123 once again comes from expansion chamber 106. Desirably, the closing of shutoff valve 110 and the opening of shutoff valve 109 occurs in a manner to maintain a substantially continuous flow of the etching gas mixture to main chamber 123. To this end, it is envisioned that shutoff valve 109 can be opened before, after or at substantially the same time that shutoff valve 110 is closed. Desirably, shutoff valve 109 is opened a few moments before shutoff valve 110 is closed, whereupon expansion chambers 108 and 106 are both connected to supply etching gas mixture to main chamber 123. To avoid the flow of the etching gas mixture from the higher pressure expansion chamber 106 (discussed hereinafter) to the lower pressure expansion chamber 108 when shutoff valves 109 and 110 are both open, another suitable anti-back flow feature (not shown) can be incorporated in line with the flow of the etching gas mixture through shutoff valve 110 to avoid or prevent the etching gas mixture from flowing from expansion chamber 106 to expansion chamber 108. Alternatively, a single anti-back flow feature can be used in line with the flow of the etching gas mixture through both shutoff valves 109 and 110 to avoid or prevent the etching gas mixture from flowing from expansion chamber 106 to expansion chamber 108, or vice versa.

Desirably, as discussed above, to avoid the flow rate of the etching gas mixture deviating from, e.g., deviating above, the predetermined flow rate, the position of the valve of flow controller 101 can be adjusted preemptively (e.g., partially closed) when switching the source of the etching gas mixture from one expansion chamber to the other.

Immediately following the change of the source of the etching gas mixture to main chamber 123 from expansion chamber 106 to expansion chamber 108, expansion chamber 106 is evacuated and charged again in the above-described manner so that it is ready for use when expansion chamber 108 can no longer support sufficient etching gas mixture flow. Similarly, immediately following the change of the source of the etching gas mixture to main chamber 123 from expansion chamber 108 to expansion chamber 106, expansion chamber 108 is evacuated and charged again in the above-described manner so that it is ready for use when expansion chamber 106 can no longer support sufficient etching gas mixture flow. This sequence of alternating the source of the etching gas mixture to main chamber 123 between expansion chambers 106 and 108 continues until sample S has been etched to a desired extent or until sample S has been etched for a desired period of time. Desirably, the sequence of alternating between expansion chambers 106 and 108 is performed in a manner that maintains a substantially constant flow rate of the etching gas mixture through main chamber 123 during the time sample S is being etched.

Although the position of the control valve of flow controller 101 is one means to estimate the capacity of an expansion chamber to support the predetermined flow rate, other means, including examining the pressure in one or both of expansion chambers 106 and 108 via sensors 105 and 107, is also possible. In the case of examining expansion chamber pressure, determinations from look-up tables, previous results, or analytical models can be used to decide at what pressure to switch between expansion chambers during an etch.

As described in U.S. Pat. No. 6,887,337, which is incorporated herein by reference, variable volume expansion chambers can be used which can be collapsed in a continuous fashion to maintain a constant pressure at the inlet of the flow controller 101. However, in the present invention, it would be necessary to incorporate the percent that the expansion chamber has been collapsed to decide when to switch between expansion chambers. Specifically, when one expansion chamber is nearing fully collapsed, the other expansion chamber should be used. It should be noted that the pressure at the inlet of flow controller 101 can be controlled by the speed at which the expansion chamber is collapsed during the etch.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of etching a sample via an etching system having an etching gas source, a main chamber where etching of a sample occurs, a first expansion chamber, a second expansion chamber, a flow controller, means for connecting each expansion chamber to the flow controller and to the source of etching gas, and a pressure controller for setting a pressure of the etching gas in the main chamber to a setpoint pressure, the method comprising:
   (a) controlling the means for connecting to charge the first expansion chamber with a suitable amount of etching gas from the etching gas source to sustain a constant flow of etching gas to the main chamber, and once charged is isolated therefrom;
   (b) controlling the means for connecting to connect the charged first expansion chamber to the main chamber via the flow controller, whereupon the charge of etching gas in the first expansion chamber flows to the main chamber via the flow controller such that the pressure of etching gas inside the first expansion chamber decreases while the pressure in the main chamber is at the setpoint pressure;
   (c) while etching gas in the first expansion chamber is flowing to the main chamber via the flow controller, controlling the means for connecting such that the second expansion chamber is charged with a suitable amount of etching gas from the etching gas source to sustain a constant flow of etching gas to the main chamber, and once charged is isolated therefrom;
   (d) following step (c), controlling the means for connecting to isolate the first expansion chamber from the main chamber and to connect the second expansion chamber to the main chamber via the flow controller before a pressure of the etching gas in the first expansion chamber decreases below a level sufficient to sustain a constant flow of etching gas to the main chamber at the setpoint pressure;
   (e) following step (d), while etching gas in the second expansion chamber is flowing to the main chamber via the flow controller, controlling the means for connecting such that the first expansion chamber is charged with a suitable amount of etching gas from the etching gas source to sustain a constant flow of etching gas to the main chamber, and once charged is isolated therefrom; and (f) following step (e), controlling the means for connecting to isolate the second expansion chamber from the main chamber and to connect the first expansion chamber to the main chamber via the flow controller before a pressure of the etching gas in the second expansion chamber decreases below a level sufficient to sustain a constant flow of etching gas to the main chamber at the setpoint pressure.

2. The method of claim 1, further including repeating steps (c)-(f).

3. The method of claim 1, wherein, in steps (d) and (f), the means for connecting is controlled to simultaneously connect the first and second expansion chambers to the main chamber.

4. The method of claim 3, wherein the first and second expansion chambers are simultaneously connected to the main chamber momentarily.

5. The method of claim 3, wherein:
the etching system includes means for preventing etching gas from flowing from the first expansion chamber to the second expansion chamber, and vice versa, when the first and second expansion chambers are simultaneously connected to the main chamber;
in step (d), the means for preventing is operative for preventing the flow etching gas from the second expansion chamber into the first expansion chamber when the first and second expansion chambers are simultaneously connected to the main chamber; and
in step (f), the means for preventing is operative for preventing the flow etching gas from the first expansion chamber into the second expansion chamber when the first and second expansion chambers are simultaneously connected to the main chamber.

6. The method of claim 1, wherein, at least one of step (a), step (c) and step (e) includes controlling the means for connecting to charge the corresponding expansion chamber with an inert gas from an inert gas source coupled to the means for connecting.

7. The method of claim 6, wherein the inert gas is nitrogen, helium, argon, xenon or some combination thereof.

* * * * *